United States Patent
Qian

(10) Patent No.: US 8,176,445 B1
(45) Date of Patent: May 8, 2012

(54) METHOD AND SYSTEM FOR OPTIMIZING INTEGRATED CIRCUIT LAYOUT

(75) Inventor: Qi-De Qian, Sant Clara, CA (US)

(73) Assignee: Qi-De Qian, Santa Clara, CA (US)

( * ) Notice: Subject to any disclaimer, the term of this patent is extended or adjusted under 35 U.S.C. 154(b) by 952 days.

(21) Appl. No.: 12/181,460

(22) Filed: Jul. 29, 2008

Related U.S. Application Data

(63) Continuation-in-part of application No. 10/907,814, filed on Apr. 15, 2005, now Pat. No. 7,448,012.

(51) Int. Cl.
  *G06F 17/50* (2006.01)

(52) U.S. Cl. ............... 716/52; 716/51; 716/53; 716/54; 716/122

(58) Field of Classification Search ............. 716/51–54, 716/122
  See application file for complete search history.

(56) References Cited

U.S. PATENT DOCUMENTS

| | | | | |
|---|---|---|---|---|
| 6,077,310 A | * | 6/2000 | Yamamoto et al. | 716/53 |
| 6,681,376 B1 | * | 1/2004 | Balasinski et al. | 716/56 |
| 7,149,999 B2 | * | 12/2006 | Kahng et al. | 716/53 |
| 7,614,032 B2 | * | 11/2009 | Kahng et al. | 716/56 |
| 7,814,456 B2 | * | 10/2010 | Gupta et al. | 716/100 |

OTHER PUBLICATIONS

Gupta et al.; "Joining the design and mask flows for better and cheaper masks"; 24th Annual BACUS Symposium on Photomask Technology; Monterey, CA, USA; Sep. 14, 2004; pp. 318-329.*

* cited by examiner

*Primary Examiner* — Naum Levin

(57) ABSTRACT

We disclose a method for optimizing integrated circuit layout which comprises analyzing constraint relationship among objects in an initial layout; constructing local modifications to the constraint relationship; forming new constraint relationships by combining initial constraint relationships with their local modifications; and producing a new layout by implementing the new constraint relationships. Local modification to constraints provides a framework for bringing detailed local information into the design process in a highly automated manner, which can be applied to a wide range of situations. We disclose preferred embodiments on improving lithography printability, reducing defect susceptibility, and improving circuit performance such as reducing layout variability and leakage.

20 Claims, 10 Drawing Sheets

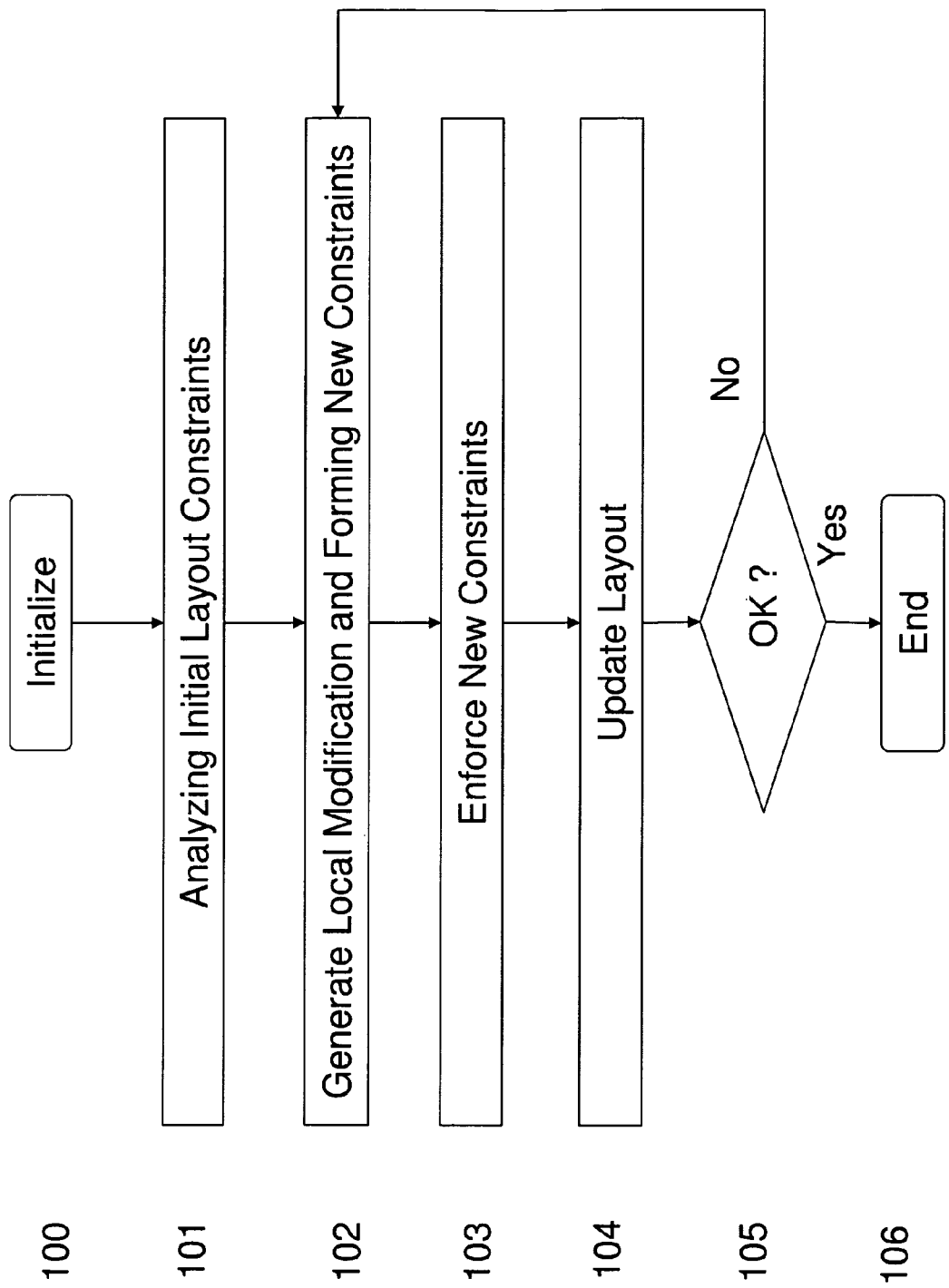

METHOD AND SYSTEM FOR OPTIMIZING INTEGRATED CIRCUIT LAYOUT

CROSS REFERENCE TO RELATED APPLICATIONS

This application is a continuation-in-part of and claims priority to U.S. patent application Ser. No. 10/907,814 filed on Apr. 15, 2005.

This application is also related to copending application by Qi-De Qian entitled "Anisotropic Layout for Integrated Circuits" filed on even date herewith.

Each application referenced above is incorporated herein by reference in its entirety.

FIELD OF THE INVENTION

The present invention relates generally to integrated-circuit manufacturing and more particularly to methods and system for generating and optimizing its layout artwork.

PRIOR ART

An integrated circuit ("IC") is a semiconductor device that includes many electronic components (e.g., transistors, diodes, etc.). These components are interconnected to form larger scale circuit building blocks (e.g., gates, cells, memory units, arithmetic units, controllers, decoders, etc.) on the IC. These circuit building blocks are the building blocks of even larger building blocks (e.g., a microprocessor). In this way, a complex system on chip is broken down into manageable pieces.

During IC design process, design engineers transforming circuit description of the IC's into geometric descriptions, called layouts. In this disclosure, a layout has a circuit associated with it. A circuit, however, may not have a layout. This is because circuit design happens before layout design which is performed according to a circuit.

The layout design process likewise takes a building block by building block approach. To create an integrated circuit layout, design engineers typically use electronic design automation ("EDA") applications. These EDA applications provide sets of computer-based tools for creating, editing, and analyzing IC design layouts. EDA applications create layouts by using geometric shapes that represent different materials and devices on IC's. For instance, EDA tools commonly use rectangles to represent the wire segments that interconnect the IC components. These EDA tools also represent electronic and circuit IC components as geometric objects with varying shapes and sizes.

An example of the basic geometric object is a straight edge. An edge has at least two points that define the starting and ending locations. Additional points may exist or can be added along the straight line such that an edge is divided into shorter edge segments. These segments are themselves edges. Bends or jogs are created when an edge segment moves in a way different from the original straight edge. In this disclosure, we call use the term edge and edge segment interchangeably.

A layout is a blueprint for fabricating the IC on silicon. It typically comprise multiple layers representing diffusion, polysilicon, contact, via and metal layers etc.

A related but very different type of geometry representation is the mask layout. A mask is an object used by a lithography imaging system, whose image forms the desired pattern on silicon. In modern processing technologies, the geometry representation in a layout, or design layout, is very different from that in a mask layout. This is because the geometric representation in a mask layout is heavily pre-distorted by processes such as optical proximity correction (OPC) and phase shifting such that its image can best represent the desired pattern on silicon. In this disclosure, the term "layout" refers to design layout unless specifically pointed out otherwise.

In modern processing technology, the manufacturing yield of an integrated circuit depends heavily on its layout construction. For a given manufacturing process, a corresponding set of design rules are applied during chip layout to avoid geometry patterns that can cause chip failure. These design rules are issued by the party who is responsible for chip fabrication in order to guarantee the yield. A typical design rule set comprises constraints on layout geometry parameters such as minimum spacing, minimal line width, etc.

Prior art layout construction systems apply design rules over a wide chip area, and to entire classes of circuits. For this reason, the design rule must cover the worst case in all products. Failure to capture the absolute worst case in all chips would lead to systematic yield failure.

In modern processing technologies such as advanced photolithography, many layout features may interact during chip processing. When the interaction distance increases to greater than a few minimal pitches, the number of interacting features increases sharply. For this reason, the feature dependent interactions are difficult to capture with precise design rules. In practice, one makes global design rule sufficiently relax in order to guarantee the yield.

The drawback of this approach is at least two fold: firstly, by using the worst possible situation as the rule, it clearly wastes valuable chip area, and secondly, finding the worst case feature combination in chips of all kinds, including those that have not been designed at the time of design rule formulation, is a non-trivial task that consumes large engineering resources.

For the forgoing reason, there is a need for an intelligent and automatic local optimization mechanism that can refine design rule constraints according to specific conditions within the interaction range.

Other emerging processing technologies alter the properties of circuits in ways that are difficult to predict before the layout is completed. An example of this is the dependency of metal-oxide-semiconductor (MOS) transistor on material stress. The drive current of an MOS device cannot be accurately determined until its local conditions are fully known. This need for detailed local information before such information can be supplied introduces an undesired variability between the pre-layout design intent and the actual post layout performance. A designer must first estimate the initial size of transistors then iteratively adjust them by hand after the layout is completed. Here again, is a need for an intelligent and automatic local optimization mechanism in order to eliminate time consuming engineering effort.

For the forgoing reasons, there is a need for a technology that intelligently and automatically adjusts a design layout according to local neighborhood conditions.

SUMMARY OF INVENTION

The present invention is directed to a method implemented in a computer that satisfies the need for a technology that intelligently and automatically adjusts a design layout according to local neighborhood conditions. A method having features of the present invention comprises the steps of: analyzing constraint relationship among layout objects in an initial design layout; formulating local modification to these constraint relationships based on the intelligence gathered from the local condition in the initial layout; forming new constraint relationship by incorporating these local modifications into the constraint relationship in the initial layout; and producing a new design layout by implementing these new constraint relationships in a manner that is substantially in compliance with factory issued design rules.

The present invention established a systematic framework for optimizing a design layout by incorporating precise local intelligence into the constraint relationships.

For yield optimization, the present invention provides a local process modification value to factory issued design rule constraints. Local process modification represents an additional safeguard distance beyond the design rule constraint distance. The local process modification value can be calculated from simulated process responses or from look-up data tables. The original design rule distance plus local process modification creates a new constraint for every unique local situation. With this additional local safeguard, we can reduce the guard band during design rule formulation and improve chip yield by eliminating processing hotspots that often arise from low probability, undesirable local feature combinations.

For circuit optimization, the present invention provides local modifications to edges that influence the performance of a transistor, especially to the edges that form the structure of the transistor, such as channel length, channel width, and other structural parameters representing stress and well proximity effect in a metal-oxide-semiconductor (MOS) transistor. Local modification can be calculated from simulated drive current response to the changes in these structural parameters, which are controlled by the edge positions. The technique of using original transistor structural dimension plus local modification to adjust circuit behavior has a wide range of applications such as reducing leakage power, compensating for the discrepancy between pre-layout and post-layout transistor performances, and to compensating for discrepancy between pairs of matched transistors.

The present invention applies to any types of amplification devices as long as their characteristics are controlled by their structural parameters.

A version of the present method incorporates an automatic process to generate the initial layout from circuit schematic, factory design rules, and design objective requirements. In prior art, automatically generated layout typically lacks the quality of a manually drawn layout, thus the optimization technology disclosed here is particularly effective in improving various aspects of the automatic layout generation process.

Another version of the present invention first partitions a large layout into smaller blocks that are more manageable from the computation point of view. A set of boundary conditions are extracted to ensure that each block is compatible to the environments that it must fit into after optimizing. The smaller blocks are subsequently optimized according to the optimization technology disclosed here, in a manner compatible with the boundary conditions, and then put back into the large layout.

In a version of the present invention, in order to improve a layout beyond just satisfying the minimal conditions for correctness and functionality, we formulate a local modification to the constraint relationship in order to further improve the layout for higher performance and yield. This is accomplished by relating the position of edges to a performance metric such as lithography printability, defect susceptibility, and transistor performance; whereby a change in the edge locations would leads to a corresponding change the performance metric.

In a preferred embodiment, the functional relationship between edge locations and said performance metrics are established by simulation tools that simulate the performance responses given a physical structure of the problem. This class of simulators, which are often referred to as technology computer aided design (TCAD) simulators, is used extensively in IC technology development. With the cause and effect established, by means such as TCAD tools, the inventor can change the positions of the edges in such a way that the performance metrics of the entire layout become more desirable.

In a preferred embodiment relating to lithography, the inventor receives image printability data and analyzes it to find the correlation between the positions of edges to the printability metric. He then calculates the direction and amount of change in the distances among the edges in a constraint relationship such that the image printability metric improves. For example, if the image metric for a pair of lines shows that they are difficult to resolve, such as the contrast between the lines is low and the image contour of edges tend to merge, an appropriate modification to the distance between the two lines would typically be to increase their separation.

In a preferred embodiment relating to reducing the susceptibility of a layout to defect particles, the inventor formulates the local process modification by relating the constraint distances among edges to the critical area such that the number of defects that can cause damage to the circuit is reduced.

In a preferred embodiment relating to optimizing the circuit performance associated with a layout, the inventor formulates a local modification to the constraints among edges that influence the current-voltage relationship of the amplification devices, especially those edges that form the structure of the devices. These edges directly influence the current-voltage characteristics of the devices and their related electrical properties. Because the current-voltage properties of the amplification device are used in a circuit simulator, such as SPICE, to predict circuit performance, changing the position of these edges through local modifications to the constraints among them can effectively tune the circuit performance while maintaining the compatibility of the layout to factory issued design rules.

In a preferred embodiment, the inventor simulates circuit performance using the initial layout and compares the result to the pre-layout design target. If the simulated post-layout circuit performance differs significantly from the pre-layout design target, he adds local modification value to the constraints among the edges that form the structure of the amplification device such that the difference between the pre-layout target and post-layout performance is minimized.

In a preferred embodiment, the inventor extracts the devices in a critical path of the circuit and formulates the local modifications to improve one set of performance metrics, such as circuit delay. For the remaining devices, the inventor formulates a different set of local modifications to improve a different set of performance metrics, such as leakage current.

In a preferred embodiment, the inventor combines the local modifications with the initial constraint relationships by forming a system of constraint equations using the newly combined constraints, thus molding the problem into a standard constrained optimization problem. The inventor formulates an objective function based on the need of a given situation which can be any combinations of the well known objectives comprising: minimizing the area of the layout, minimizing the length of wires, and minimizing the amount of change of in edge locations, and then applies a constrained optimization procedure to form a new layout while conforming to the factory design rules.

In another preferred embodiment, the inventor applies a heuristic search method that looks for available space in the neighborhood of an edge of interest to implement the new constraints.

In a preferred embodiment, the new layout thus created is checked to determine if the results are satisfactory based on a set of predetermined criteria. If not, the new layout is used as a new input layout for another iteration that repeats part of this optimization method, which may start from any one of the preceding steps depending on the nature of the problem.

In a preferred embodiment, the satisfactory criteria comprise the following: conformity with factory issued design rules, conformity to chip area requirements, magnitude of improvements on layout manufacturability, magnitude of improvements on circuit performance, and their combinations.

BRIEF DESCRIPTION OF THE DRAWINGS

These and other features, aspects, and advantages of the present invention will become better understood with regard to the following description, appended claims, and accompanying drawings where:

FIG. 1b is a flow and block diagram showing a method and system in accordance with another version of the present invention;

Definition List 1

| Term | Definition |
| --- | --- |
| Minimal width | Constraint distance between a pair of interior-facing edges that belong to the same layer. |
| Minimal space | Constraint distance between a pair of exterior-facing edges. |
| Minimal overlap | Constraint distance between a pair of interior-facing edges that belong to different layers. |
| Minimal enclosure | Constraint distance from an inside edge to an outside edge when the polygon of the inside edge is fully inside the polygon of the outside edge. |
| Minimal extension | Distance from an inside edge to an outside edge. |
| Layout | A geometric representation of circuit, typically comprising a plurality of layers. |
| Mask | An object whose image defines a pattern on silicon that implements a layer in a circuit layout. |

DETAILED DESCRIPTION OF THE PREFERRED EMBODIMENTS

Some preferred embodiments of the present invention will be described in detail with reference to the related drawings of FIGS. 1-5. Additional embodiments, features and/or advantages of the invention will become apparent from the ensuing description or may be learned by the practice of the invention.

The methods and apparatus described here are with respect to integrated circuit manufacturing; however, the techniques described here can be applied to manufacturing or design of any device. Examples of these include integrated optical devices, microelectromechanical systems (MEMS), gene chips, micromachines, disk drive heads, etc.

The following description includes the best mode presently contemplated for carrying out the invention. This description is not to be taken in a limiting sense, but is made merely for describing the general principles of the invention.

The present invention is directed to method and system for improving the manufacturing yield, circuit performance, and design efficiency of an integrated circuit by optimizing its layout pattern.

Overview of Layout Optimization Method

Figure 1A:
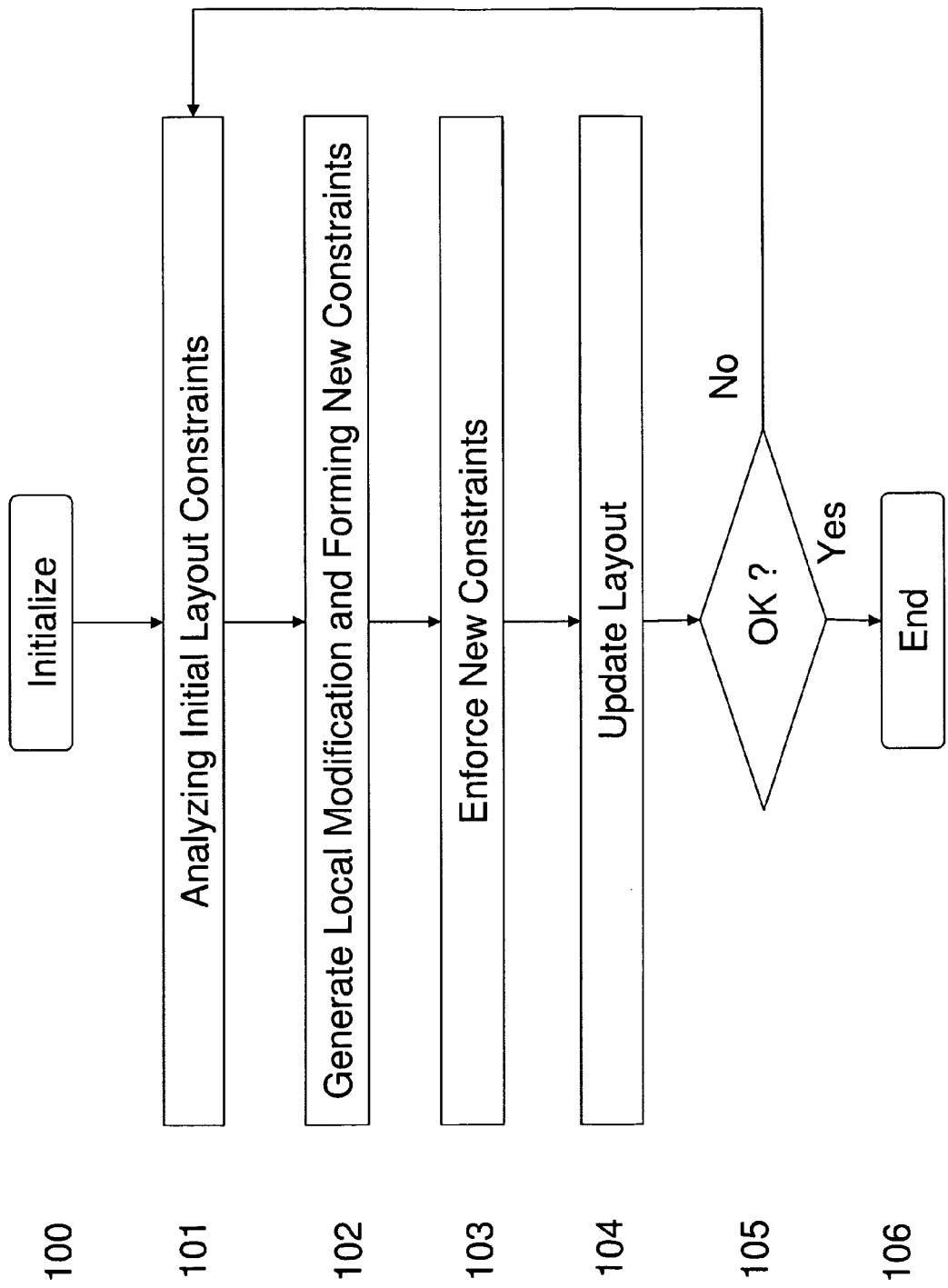
FIG. 1a is a flow and block diagram showing a method and system in accordance with a version of the present invention.
Figure 1C:
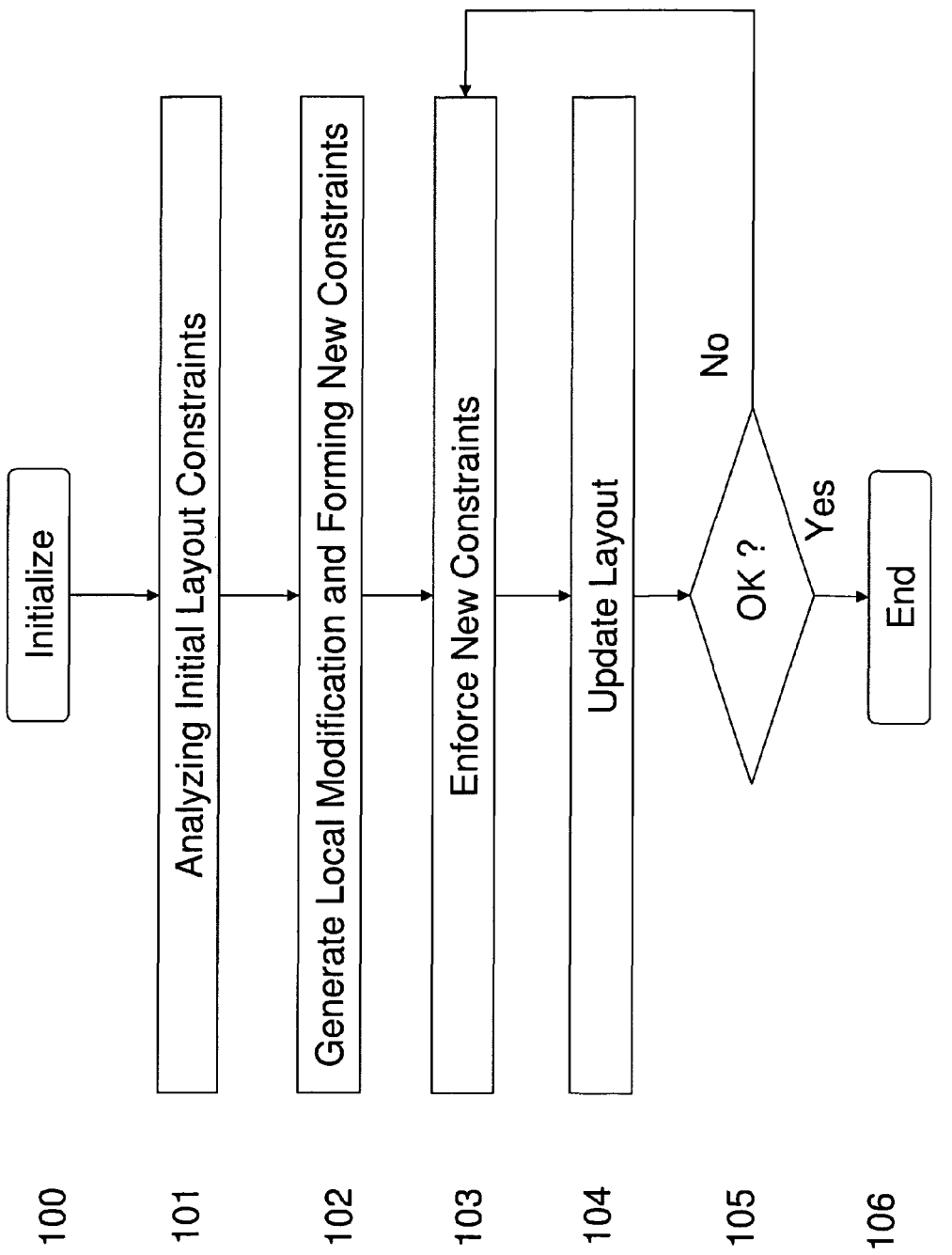
FIG. 1c is a flow and block diagram showing a method and system in accordance with yet another version of the present invention.

FIG. 1 shows a block and flow diagram for a version of the present invention.

Block 100 acquires initial design layout and associated information for optimization.

Block 101 analyzes the constraint relationship among layout objects. In order for a design layout to be valid, the relative distances among its internal objects are constrained by factory issued design rule and by designer's intent. Design intent constraints comprise, for example, the required size of a transistor and the size of the layout. Design rule constraints are issues by the factory that fabricates the layout into an integrated circuit product, or chip, which comprise, for example, the width of a line must be greater than a factory required minimal, the space between two wires must be greater than another factory require minimal. Definition List 1 shows additional examples of design rules. Note that factory issued design rule constraints are applied globally without considering any local situations.

Block 102 generates local modification values to the initial constraint relationship and form a new set of localized constraint relationship by combining the two. Local modifications to constraints are evaluated in-situ between related edges. It brings detailed local intelligence for fine tuning the constraints. Details of preferred embodiments of local modification for enhancing lithography, reducing defect susceptibility, reducing transistor variability and leakage current will be discussed along with FIG. 3.

Block 103 enforces the local constraint distance to the original layout. Preferred embodiments will be discussed along with FIG. 4.

Block 104 updates the coordinate variables in the layout according to the solution of the enforcement procedure 103 and creates a new design layout.

Block 105 checks the new layout according to a set of predetermined criteria to ensure the optimization performed by preceding steps conform to design requirements. There criteria may include: design rule cleanliness, layout area change, and circuit performance change, such as delay. If the check indicates the need for further optimization, the new layout is substituted as a new work piece layout for a new iteration. This process continues until a set of termination criteria is met.

In a preferred embodiment, a new iteration can start from any of the preceding steps 101, 102, or 103, depending on the optimization task and result of checking.

If Block 105 finds the new layout is satisfactory, the new layout is saved in memory for further processing by other design software or output to a storage device or display. Common format for outputting to a storage device include GDSII, OASIS, CIF, and ASCII text.

Initialization

In a version of the present invention, the initialization step sets up the operation by acquiring the initial layout and parameters associated with its design and fabrication.

Initialization for manufacturability optimization comprises acquiring information relating to the fabrication process. These include factory issued design rules, simulation models, manufacturing equipment settings, material options, empirical fitting parameter, and look-up data tables.

Information for lithography printability enhancement include data and/or model for simulating the image of a specific layer in the layout onto silicon wafer, which comprise models and parameters during the tapeout, lithography, and etching. The term lithography in this disclosure refers to pattern transfer from a design layout to structures on silicon, these steps comprise tapeout, which converts a specific layer in a layout to a mask data set; lithography, which images a mask into a temporary photoresist layers on silicon; and etching, which transfers the image in photoresist into materials on silicon.

Information for defect susceptibility reduction comprises data and/or model for defect distribution.

Information for transistor variability reduction further comprise simulation models for the transistor, such as compact transistor models in a circuit simulator, all of which are capable of simulating the current-voltage characteristic given the transistor structural parameters. Among these models, the compact model that used extensively for circuit design has the advantage of high speed and a high degree of calibration. Other models that relating transistor performance to its structural parameter, such as finite difference and finite element models can also be applied. These models require more computing power but are generally regarded as more predictive than the compact model.

Optimization System Implementation

The initialization step also acquires the initial design layout which is the work piece for the present method. Said design layout comprises a plurality of interrelated layout objects, one or more layers, and can be flat or organized in a hierarchical data structure comprising a plurality of building blocks such as masters, cells, and/or array instances, which are themselves made of smaller building blocks.

In a version of the present invention, the initial design layout is read from an input device. The layout data format comprises the standard GDSII, OASIS, or LEF/DEF format. Polygonal information is supplied for file format that does not directly specify polygons. For example, in some file format, a piece of wire is specified as a line with a certain width, rather than a fully formed rectangle. In a preferred embodiment, the initialization step converts features such as a path into concrete polygonal shapes.

Figure 2A:
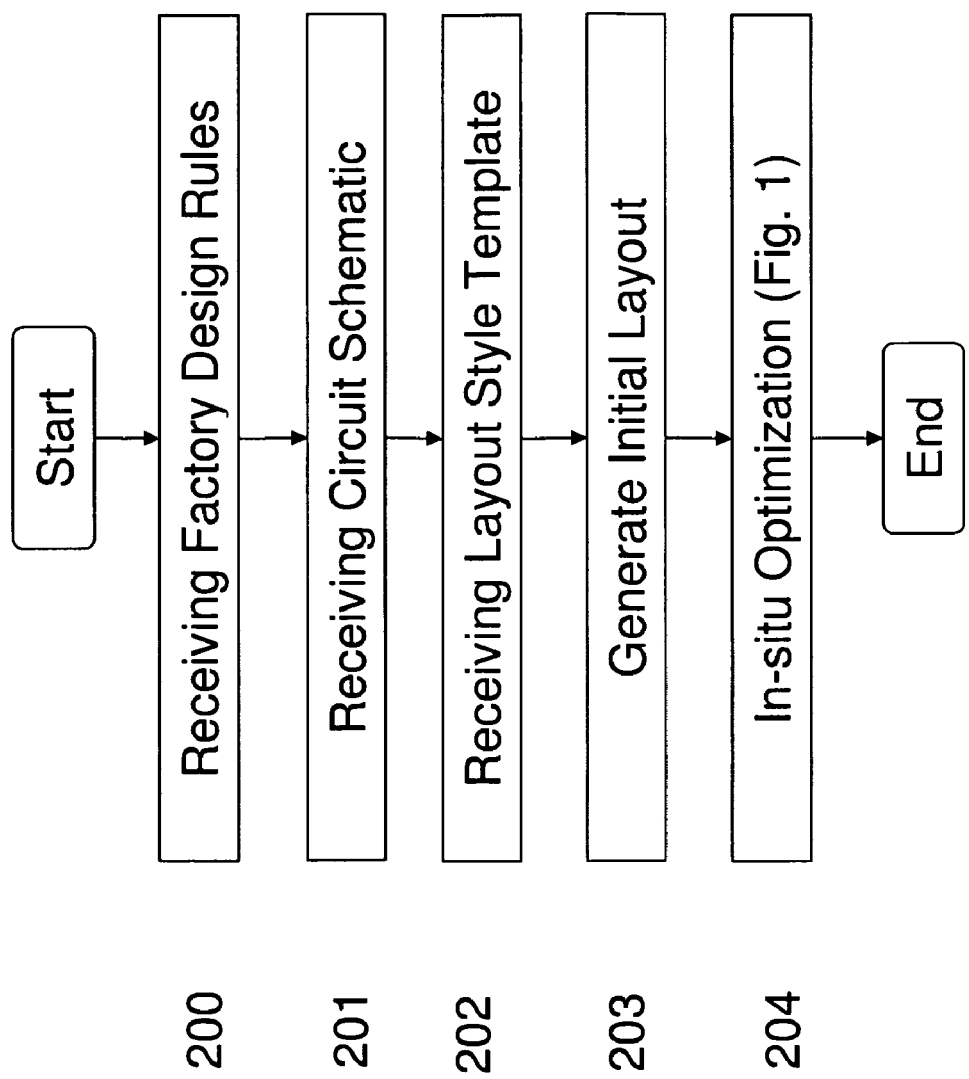
FIG. 2a is a flow and block diagram showing a layout generation system that incorporates in-situ layout optimization to further improve an initial layout.

In another version of the present invention, the initial layout is automatically generated by a computerized process shown in FIG. 2a. It starts by receiving factory design rules (200), the schematic for the circuit (201), and a layout style template (203) (202). The factory design rule (200) comprises minimum width of the different layers used in a layout as well as spacing requirements associated with those layers. The process design rules also specify electrical characteristics such as resistance and capacitance for each layer. The schematic (201) comprises a list of transistors and signals connected to each of those transistors. It specifies the pre-layout size of transistors and the input/output (I/O) signal ports. The library style template (202) comprises required cell size, the dimensions and locations of the supply sources and routing tracks. The layout generator (203) generates the layout using a process commonly known as transistor folding, or by other processes known in the art.

A layout generated by layout generator is generally inferior to its manually designed counterpart. This is in part because of the lack of in-situ detailed optimization on performance and yield. This version of the present invention improves the performance of layout generator by applying in-situ optimization process of the present invention (204) to the automatic layout generation process.

In a preferred embodiment, the layout generator (203) keeps track of constraint relationship between layout objects during layout generation. The constraint relationship associated with generated initial layout can be passed directly to the in-situ layout optimizer as the initial layout constraint (101) in order to save computation time.

Figure 2B:
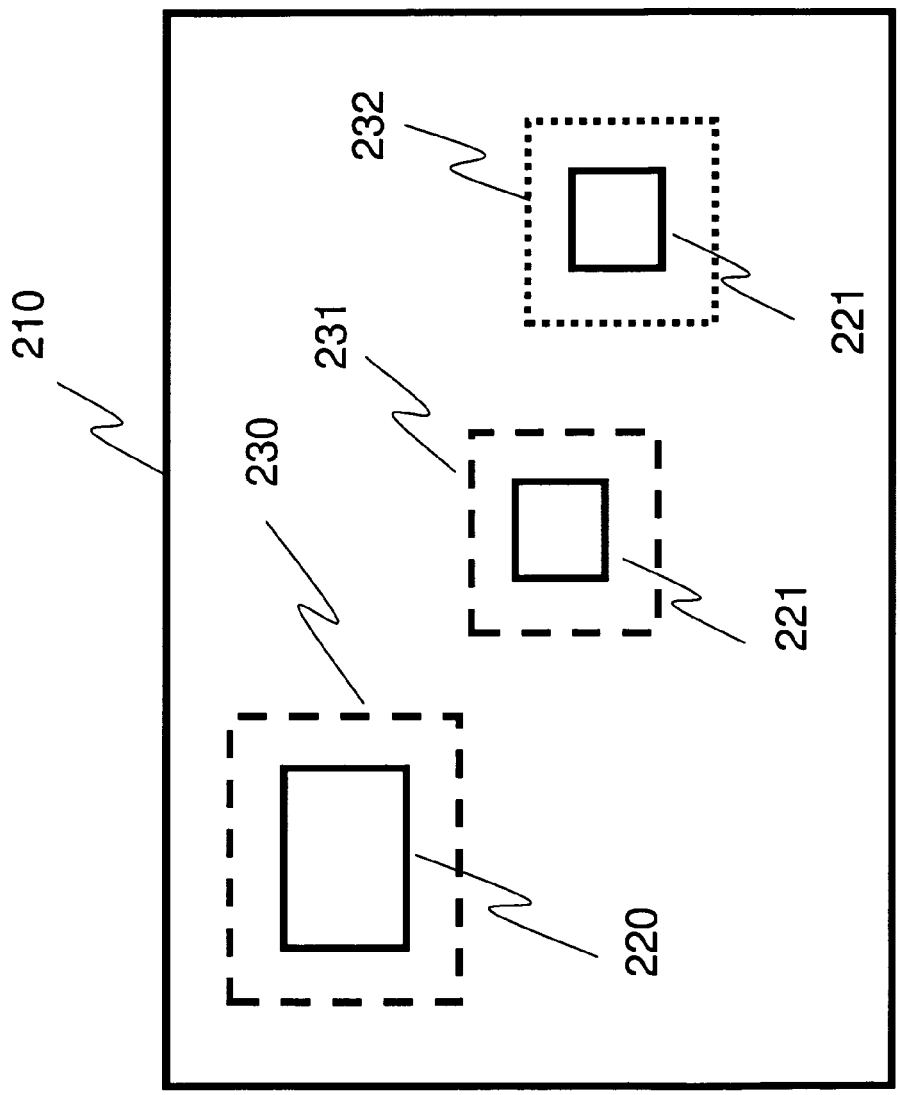
FIG. 2b is an illustration showing the extraction of a layout block from a larger layout.

In yet another version of the present invention, a layout partition step of FIG. 2b is applied in order to reduce computation time. Here we first partition a large layout (210) into smaller blocks. A smaller block (220) comprises interrelated layers and layout objects at or within its boundary. We next derive a set of boundary conditions for block 220 using information on its surrounding features within box 230, which is expanded by predefined interaction distances in horizontal and vertical directions. These boundary conditions ensure that the subsequent optimization operations performed within 220 are compatible to its surrounding environments. Examples of this boundary condition are the width and height of the block shall not change and the connection points within the block to other part of circuit, or pins, as they are known in the art, be fixed. We next optimize the extracted block 220 by using it as the initial layout for the process outlined in FIG. 1 along with said boundary conditions that are derived from 230. After optimization we put the optimized block back into the original layout. The boundary conditions ensure that the back insertion of optimized block is compatible with the rest of the layout.

In a preferred embodiment, the extraction process for circuit blocks is performed for all critical blocks in the original layout. Parallel data processing or specially designed hardware are ideal for this embodiment.

In another embodiment, the smaller block 221 is a natural building block of the layout such as a standard cell. A cell is typically instantiated repeatedly in a layout with different surrounding conditions. For example cell 221 is instantiated in two places with different surroundings 231 and 232. In a preferred embodiment, the inventor formulates the boundary condition by taking into account both conditions 231 and 232, such as finding the worst case condition.

In yet another preferred embodiment, the initial layout is the result of a previous iteration of the present method.

Analyzing Constraint Relationship

In a layout, the constraint relationships define the minimal requirement for a layout to be manufacturable and functional. They require the coordinate variables of the layout object to satisfy expressions in the form of $Ci( \ldots xi,yi,xj,yj \ldots xm,ym) > Dij$, where Ci is a function of the coordinate variables of layout objects $xi,yi$, $xj,yj$, and $xm,ym$; Dij is a constant; and I,j,m are integer numbers. Constraint relationships do not typically fully define a unique layout; therefore, a designer often uses optimization technology to pick out the best layout among all layouts that satisfy the same constraint set $\{Ci\}$. This is a typical constrained optimization problem that can be solved by a large array of existing software tools.

In the simple one dimensional case, a typical constraint relationship is expressed in the form $xi-xj > dij\_old$, where xi and xj are locations of two interacting polygon edges in the layout, and dij_old is the constraint distance between these two edges, which can come form of factory issues design rule or from the intent of the designer. For example, dij_old can be the minimal width of a wire as required by process capabilities. In another case, it dij_old can be a design intent constraint such as the width of a particular wire that is required to carry a large amount of current, and because of this, it must be wider than the minimal wire width required by the design rule.

In a version of the present invention, analyzing constraint relationship resulting in the building of a system of initial linear constraint equations from the initial layout using design rules and circuit requirements. In a preferred embodiment, well-known procedure, such as the shadow propagation method, is applied to accomplish this task. A description of the procedure can be found in Jurgen Doenhardt and Thomas Lengauer, "Algorithm Aspects of One-Dimensional Layout Compaction", IEEE Trans. Computer-Aided design. Vol. CAD-6 no. 5 Sep. 1987. pp. 863.

Said initial linear constraint equation takes the form $AX=d\_old$, where A is a matrix of coefficients; X is a vector of positional variables comprising location of the polygon edges; and d_old is a column vector of constraint distances. Constraint distances comprise design rule constraint distances and circuit specific design intent. Examples of constraint distances are the minimal line width of wires in a layer, and the intended width of a transistor. The elements of matrix A in this equation are 1 and −1. The vector d_old is a collection of dij_old where the values of dij_old are given by the design rule or by circuit requirements.

Generating Local Modification

Using local modification for detailed local optimization provides a framework for a wide variety of applications. As discussed earlier, a constraint relationship is an equation or inequality among coordinate variables of the layout objects in the form of $Ci( \ldots xi,yi,xj,yj \ldots xm,ym) > Dij$, such as $xi-xj > dij\_old$. Similarly, the performance metric of a layout, Q, is also a general function of layout construction, which takes the form of $Q( \ldots xi,yi,xj,yj, \ldots xm,ym \ldots )$ i.e. a general function of coordinate variables of layout objects. A changing in the constraint relationship $Ci( \ldots xi,yi,xj,yj \ldots xm,ym) > Dij$, therefore, leads to a change in the coordinate variables xi, yi, which in turn leads to a change in $Q( \ldots xi,yi,xj,yj, \ldots xm,ym \ldots )$. Therefore, by changing the constraint relationship we can improve the performance metric Q.

In a preferred embodiment, the function Q is replaced by a simulator, which plays back the performance metric as a function of the structural parameters of a layout. A class of simulators called technology computer aided design (TCAD) tools is suitable for this task. These tools include lithography simulators, compact transistor models used in circuit simulation, and finite element, finite difference transistor simulators. A common characteristic of these TCAD tools is that they establish the connection between the structure of a layout and the measurable performance metrics of the layout and/or the circuit it represents. A change in the constraint relationship causes a change in structure which in turn causes a change in the performance metric. No matter how complicated the simulation is we can always establish the link between constraint relationships and performance metric as long as a simulation model can be built to establish the cause and effect. This general framework is demonstrated in FIG. 3 where we disclose preferred embodiments for lithography printability enhancement, reducing defect susceptibility, and reducing transistor variability and leakage current.

In a preferred embodiment, procedures in FIG. 3 are performed throughout the integrated circuit layout in order to improve the yield and performance of the fabricated chip. Further, weighted combinations of various performance metrics are used in order to emphasize different aspects of the yield and performance optimization For yield enhancement, using local intelligence to modify the design rule constraint reduces the reliance on finding the global worst case. Objects in a layout can be positioned closer or further based on the exact local requirement, which leads to new opportunity for chip size reduction and hotspot avoidance. For transistor optimization, local modifications to transistor structure can fine tune the transistor property to meet a variety of performance optimization tasks.

Because design rules and design intent constraints are used in nearly all physical layout design systems, the present invention is applicable to any physical design system where layout construction and optimization is performed.

For Improving Printability

Figure 3A:
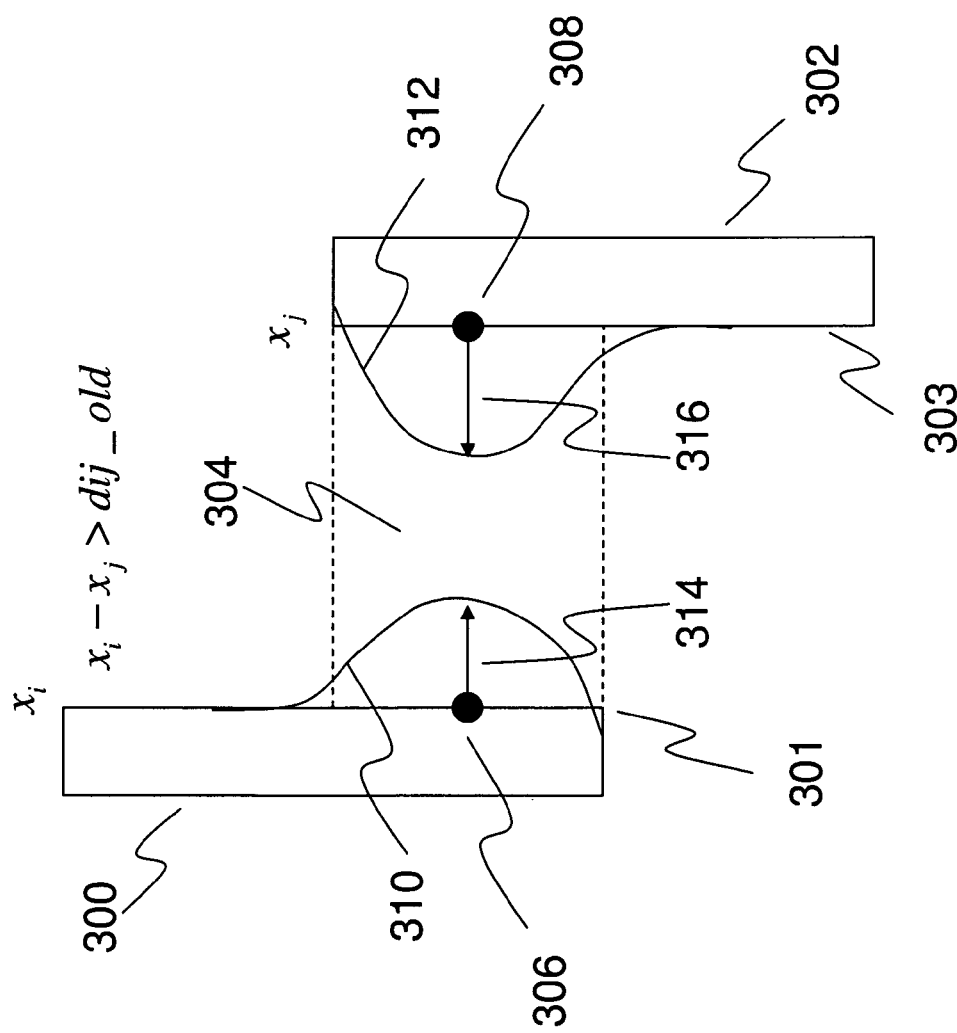
FIG. 3a is a schematic diagram illustrating the calculation of local modification for lithography printability enhancement.

For yield enhancement, the local adds extra safeguard to the existing design rule methodology. In this case, local modification is directed to enhance the process latitude; therefore, we use the term local process modification. A local process modifier, delta_dij, is larger in locations on a layout with poor process latitude. Even if a layout is already compliant with factory issued design rules, enforcing the new local constraint, $dij\_new = dij\_old + delta\_dij$, can still further improve the process latitude. FIG. 3a shows two minimally spaced lines 300 and 302. Due to reasons that are not show in the drawing, the image contour 310 of edge 301 and the image contour 312 of edge 303 tend to bridge and cause a short circuit. In this case, a local process modification computed from edge placement errors 314 and 316 tends to increase spacing between edges 301 and 303, driving them further apart, thus reducing the chance for bridging.

In a preferred embodiment, we select the control points by inspecting the interaction among edges in the layout. FIG. 3a shows two layout rectangles 300 and 302, which can be on the same layer or on different layers, with initial constraint relationship xi−xj>dij_old.

The interaction region between the right edge of 300 at xi (301) and the left edge of 302 at xj (303) is defined by the shadow of 301 on 303, as marked by the band between the two dashed lines, 304. We find the shadow region by placing a hypothetical flashlight to the left of 301 and measure its shadow on 303. Identification of shadow region of a layout edge among related objects can be accomplished in manners similar to analyzing layout constraints in block 101 of FIG. 1.

After finding the interaction region, we implement a predetermined sampling plan for laying down the control points. In FIG. 3a, we place a pair of control points 306 and 308, one on each edge, at the same height, in the middle of the shadow band. We can also choose other spatial sampling plans, such as those involving a plurality of pairs of points.

After deciding the sampling points (e.g. 306 and 308 in FIG. 3), we simulate various processing response variables at these points. In photolithography, said response variables represent local printability metric comprise image contour, edge placement error, light intensity during photolithography exposure and its derivatives, contrast, and mask error enhancement factor.

In a preferred embodiment, the response metrics mentioned above are calculated using a simulator for the generalized lithography process defined in this disclosure, which comprises the steps necessary to arrive at structure on silicon from a design layout. These steps comprise: adjusting the size of selected objects on a layout layer, adding one or more phase shifting features, adding one or more sub-resolution assist features, performing optical proximity correction, simulating the imaging of the mask onto a photoresist layer coated on silicon, and simulate the final pattern on silicon after developing the latent image in the photoresist and etching the underlying layer.

A predetermined empirical function is used to calculate the local process modification value from said processing response variables.

For the example in FIG. 3a, we select a linear function of edge placement error at point 306 and 308 to calculate local process modification. Edge placement error, (314/316 for the left/right edge) is defined as the perpendicular distance from intended edge location (xi/xj for the left/right edge) to the simulated edge location as predicted by the image contour, 310/312 for the left/right edge.

Once the edge placement errors are calculated for the two interacting edges, the local process modification value is expressed as w1*EPE_i+w2*EPE_j, where EPE_i 314 and EPE_j 316 are the edge placement errors at 306 and 308 respectively, and w1 and w2 are user specified weighting factors. Local constraint for edges 301 and 303 can now be expressed as dij_new=dij_old+w1*EPE_i+w2*EPE_j.

Variations in functional forms for local process modification can be constructed and additional process variables can be used in order to cover the specific needs of a particular application.

In another preferred embodiment, the local process modification value is obtained from a predetermined look-up data table. The key to the look-up data table is a set of geometry combinations that appear frequently in the layout, such as the two rectangle case show in FIG. 3a. The application uses pattern recognition technique to identify the pattern key and search the look-up table in order to obtain appropriate local process modification value. This embodiment is advantageous when the layout is very large, such as the case in dealing with large circuit blocks during or after routing. In this case, detailed evaluation of edge placement error would be too time-consuming. Instead, pattern look-up with a large number of pattern keys are preferred in order to generate local constraint or local modification to factory issued constraint.

The in-situ optimization technique of the present invention achieves a similar goal as optimal process correction (OPC). However, in contrast to OPC, which is carried out in the mask making phase when a layout is frozen, the in-situ optimization is a correct-by-construction technique that can fundamentally improve the performance of a layout before it goes to mask making. A forced correction during mask making can only superficially make a poor design to achieve an acceptable but often low yield, while a correctly constructed layout can achieve high yield naturally. In addition, in-situ optimization can reduce the need to perform OPC in large portion of layout as outlined below.

In a preferred embodiment, we tag locations where local constraint could not be enforced due to tight design constraints from both factory design rules and design intent. With these tags, a specially designed OPC system can perform localized OPC in the vicinity of the tags only. Our experiments show that only a small percentage of locations need OPC after local constraint enforcement. Therefore, the localized OPC procedure will greatly reduce the mask complexity compared to the standard, blanket OPC procedure performed today.

According to another version of the present invention, we calculate the local process modification value following a hotspot detection procedure. Hotspot detection comprises simulating the image of the layout and measuring the difference between said image and the design intent. A processing hotspot is a location where EPE is larger than a predetermined threshold. After finding the hotspots, detailed analysis of the process latitude is performed in the neighborhood and local process modification values are computed from a predicted safety margin.

For Reducing Defect Susceptibility

Defect particles are present in an integrated circuit production line. Defect related yield enhancement using techniques such as critical area analysis has been a subject of active research since the early days. It is generally accepted that the susceptibility of a layout to defect particles can be reduced by positioning layout objects such that the defect particles do not cause short circuit or open circuit in a fabricated chip.

In a preferred embodiment, a distribution of defect size is used for calculating the critical area of a layout. The critical area is then related to edge position in the initial layout. A local modification to the corresponding initial constraint relationship is formulated such that the area in which the center of a defect of a certain size must fall in order to cause damage is minimized.

Figure 3B:
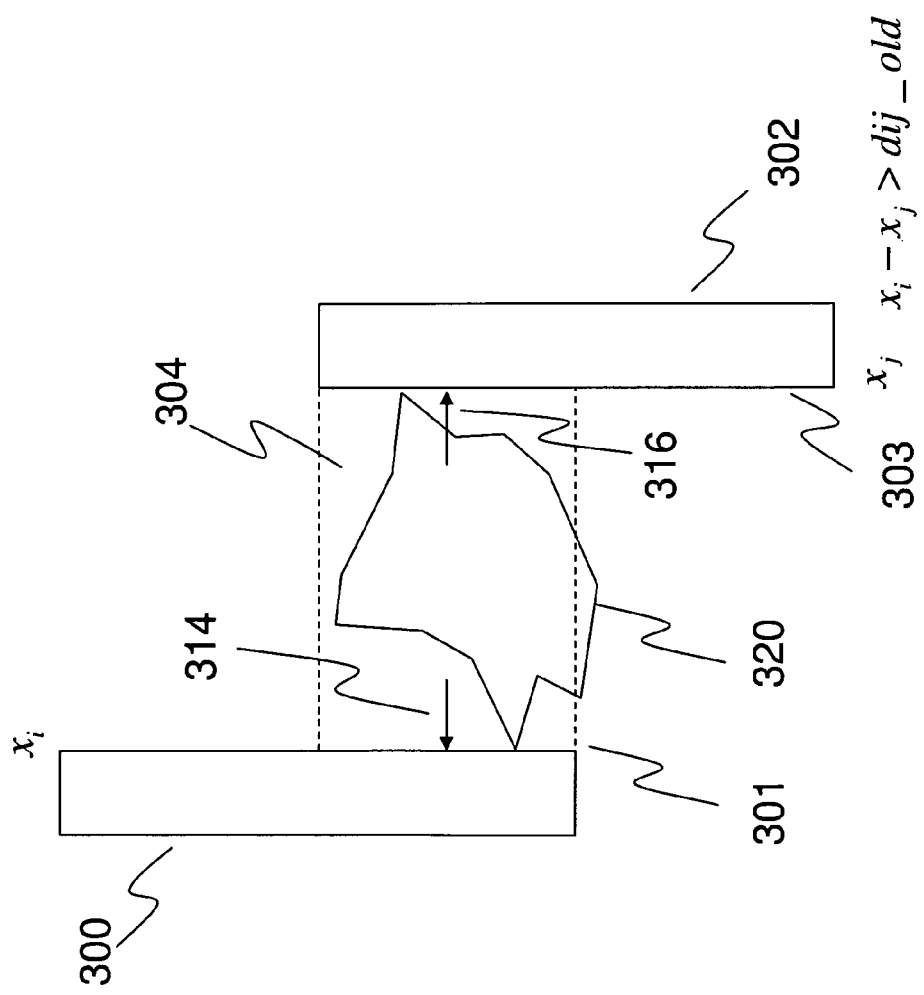
FIG. 3b is a schematic diagram illustrating the calculation of local modification for reducing the layout susceptibility to particle defects.

FIG. 3b shows a preferred embodiment for formulating local modifications to reduce defect susceptibility. The layout setup in FIG. 3b is similar to that in FIG. 3a. However, in stead of potential short circuit error caused by the bulging image contours as in FIG. 3a, the threat of short circuit in 3b comes in the form of a defect particle 320. As shown in FIG. 3b, defect 320 is at the threshold of causing a short circuit between rectangles 300 and 302 by creating a bridge. A defect that is comparatively smaller than the current separation between edges 301 and 303 will not cause a short circuit in this configuration. Therefore, by formulating a local modification that increases the separation between edges 301 and 303, we can make defect 320 to become harmless as well.

By changing the edge locations through local modification of constraints between the edges, the inventor changes the defect sensitivity by modifying the critical area, which is related to the defect size distribution and the area in which the center of a defect of certain size must fall in order to cause circuit failure.

In a preferred embodiment, local modifications are applied to reduce the critical area after a critical area analysis procedure that is well known in the art. Critical area is related to the interaction region 304, such as that formed by edges 310 and 303, which is in turn related to the coordinate variables of these edges.

In a preferred embodiment, circuit related information is applied such that modifications for avoiding short circuit error are applied only between features with different electric potentials. Emphasis is also given to features with larger interaction region where defect damage probability is the higher.

For Circuit Optimization

The optimization technique disclosed here is particularly useful for leading CMOS technologies where design productivity is adversely influenced by the tight coupling between circuit performance and local details of the layout. New technologies such as stress engineering, shallow trench isolation, and high energy well implantation for example, alter the characteristics of an MOS transistor according to local layout configuration which were unavailable at the circuit design phase. Because the exact performance of a transistor cannot be known until the physical layout is completed, which is one of the last steps in the design flow, this dependency on layout detail poses new challenges to rapid design closure.

The performance of an amplification device, such as a COMS transistor in the following discussion, is described by its current-voltage (I-V) relationship, or I-V characteristic as known in the art. During circuit design, designers simulate the properties of a circuit using a circuit simulator, such as SPICE, which includes the I-V relationship of the amplification devices. Because circuit simulation is essential for any circuit design, the IC makers provide accurate models for the I-V relationship to designers as part of the manufacturing package along with design rules.

The current-voltage relationship of an amplification device is determined by its structural parameters which are determined in turn by the layout. Thus a direct link is established from layout construction to transistor structural parameters to the model of I-V relationship and finally to the simulation model of the entire circuit. The transistor model serves as a bridge between the edge positions in a layout and the performance properties of the circuit. The performance metric Q in this case is simulated by the circuit simulator using the transistor I-V relationships.

Figure 3C:
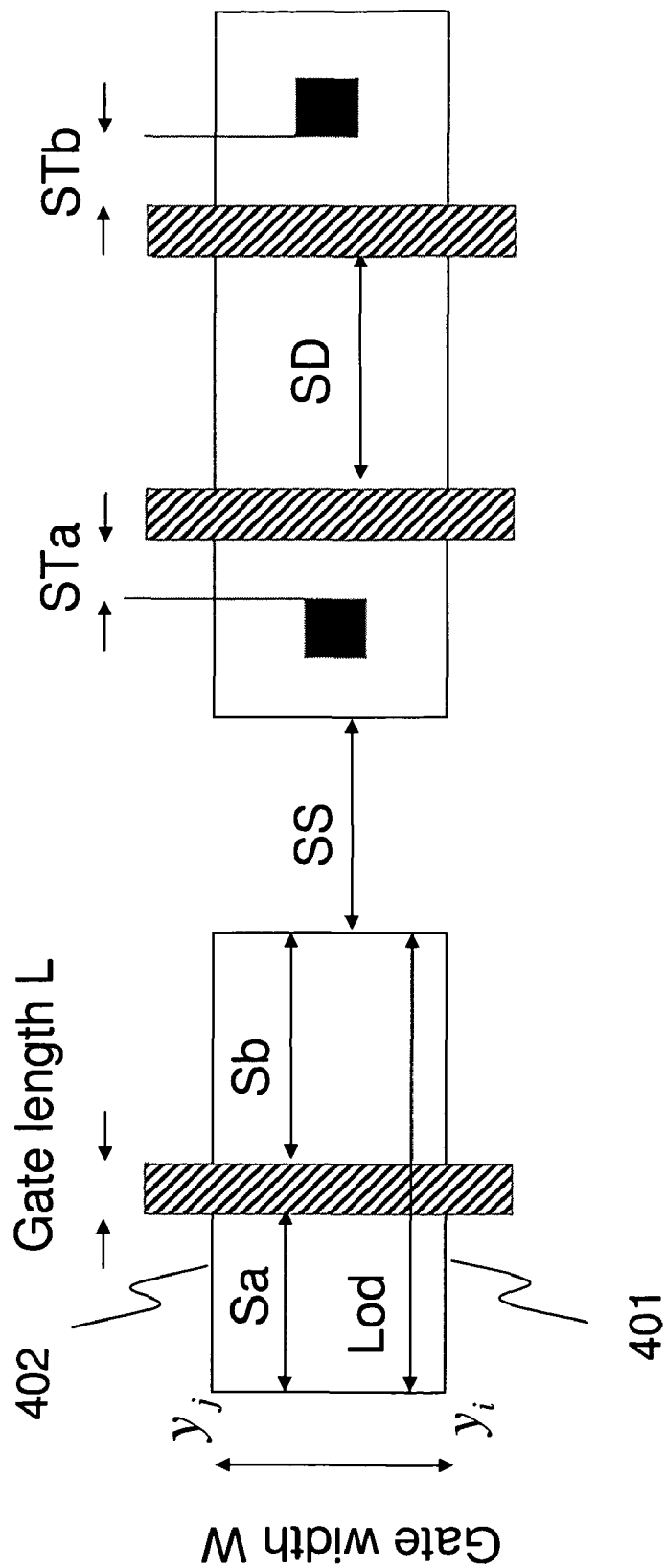
FIG. 3c is an illustration showing the layout dependent variables in a transistor where local modification can be applied to enforce design intent.

The relationship between transistor structural parameters and stress induced change in transistor properties is predicted by a variety of simulation tools. For example, it is incorporated in compact model for transistors, such as the BSIM series of models from University of California at Berkeley. FIG. 3c shows some of the structural parameters that influence the transistor property due to stress. These include the distances from gate edges to the isolation edges (Sa and Sb), the distance from one gate edge to the facing gate in the same oxide definition (SD), the separation between oxide definition regions (SS), and the distance from gate edge to a contact edge (STa and STb), etc. Because the lack of a completed layout in the circuit design phase, these parameters, which are of secondary importance, are generally unknown when the designer must determine the first order transistor structure, such and the length and width of a gate.

A version of the present invention provides a mechanism to automatically adjust the transistor structural parameters after an initial layout such that a design can rapidly converge to its initial pre-layout intent.

In a preferred embodiment, we apply local modification to the edges that define transistor structural parameters and adjust them to compensate for the deviations from the original design intent in a post-layout transistor. In said initial layout, the initial gate length and width parameters are determined by the designer according to the circuit performance requirements, but other parameters such as Lod, SS, SD, are not finalized because the lack of a concrete layout. With an initial layout, however, these parameters now have concrete values and contribute to transistor properties can now be calculated exactly. These post-layout properties, however, are likely to be different from the original pre-layout design intent. Therefore, this inventor formulates local modifications to tweak the transistor structure in order to match the pre-layout design intent.

FIG. 3c shows a preferred embodiment for the pre-layout and post-layout variability reduction. In order to match the pre-layout design intent, we formulate local modification to one or more of the edge pairs that determine transistor structure parameters, such as the polygon edges 401 at yi and 402 at yj which determine the width of the transistor on the left of FIG. 3c. The design constraints for a gate with width W_old is yi−yj>W_old and yj−yi>W_old. In a preferred embodiment, the new gate width (W_new) is modified to be the initial gate width (W_old) plus a local modification value, delta_W, i.e. W_new=W_old+delta_W, where the local modification to gate width delta_W is chosen such that the difference in transistor performance property between pre-layout design intent and post-layout implementation is minimized.

In a preferred embodiment, simulation means for evaluating transistor properties given the structural parameters, such as compact transistor models, finite difference, and finite element techniques are suitable for relating edges in a layout to transistor performance property.

Similarly, we can formulate local modifications for gate length Las L_new=L_old+delta_L; width of diffusion region Lod as Lod_new=Lod_old+delta_Lod; and the like. In a preferred embodiment, weighted combination of layout related transistor parameters is implemented in order to provide a high degrees of freedom for the adjustment, which is especially preferred in an initial layout that is already tightly packed In a preferred embodiment for minimizing the post-layout to pre-layout performance difference, the inventor simulates circuit performance using the initial layout and compares the result to the pre-layout design target. If the simulated post-layout circuit performance differs significantly from the pre-layout design target, he adds local modification value to the constraints among the transistor structural edges such that the difference between the pre-layout target and post-layout performance is minimized. Similar techniques can be applied to adjust any predetermined performance metric.

In another preferred embodiment the inventor extracts the critical path from the schematics of the initial layout, and labels these transistors as critical transistors. The operations for circuit performance optimization, such as that described above, are performed selectively on these critical transistors.

Using local modification to fine tune transistor structure has applications beyond compensating for stress effect. The same approach can be used wide variety of applications. An example is compensating for the well proximity effect (WPE) where the scattered ions in during ion implantation cause unwanted doping variation in a layout. In a preferred embodiment for WPE control, local modifications are applied between the well edges and transistor gate edges such that the distance between them increases. In another preferred embodiment, the transistor size is adjusted to compensate for the property change caused by post-layout doping change resulting from WPE.

In a version of this invention, local modification is applied to edge segments that define the channel length L of the transistor in order to reduce the leakage power of a circuit.

In a manner similar to the performance optimization technique disclosed above, transistors that are not in the critical path are labeled as non-critical transistors. The edge segments that form the channel lengths of these non-critical transistors are identified and local modifications are formulated such that these channel lengths are increased by an appropriate amount to reduce leakage current without adversely decreasing circuit performance. This can be accomplished, for example, by monitoring the circuit performance using a circuit simulator while formulating the modifications to increase the channel length constraints of non-critical transistors.

Because the leakage current is exponentially linked to channel length, this technique can be very effective in reducing the leakage power of a circuit.

In a preferred embodiment, the cause-and-effect relationship between local modification to constraints and circuit performance is formulated as a constrained optimization problem, such as those in the form of optimizing Ct*X; subject to constraints A*X=d_new.

In a preferred embodiment, a weighted combination of printability, defect susceptibility, and transistor performance enhancement is implemented to produce a high performance design layout.

Enforcing New Constraint Relationship

After generating local modification for optimizing various aspects of layout performance, a new constraint relationship is formed by combining the initial constraint relationship with these local modifications.

In a preferred embodiment, a new set of "localized" constraint relationship is generated by combining local process modification value delta_dij, with the original constraint distances generated in block 101. A constraint relationship now takes the form xi−xj>dij_new, where dij_new=dij_old+ delta_dij, which is a new "localized" constraint distance.

In a preferred embodiment, a collection of dij_new values forms the localized constraint distance vector, d_new. The system of equations for localized constraint takes the form A*X=d_new.

Figure 4:
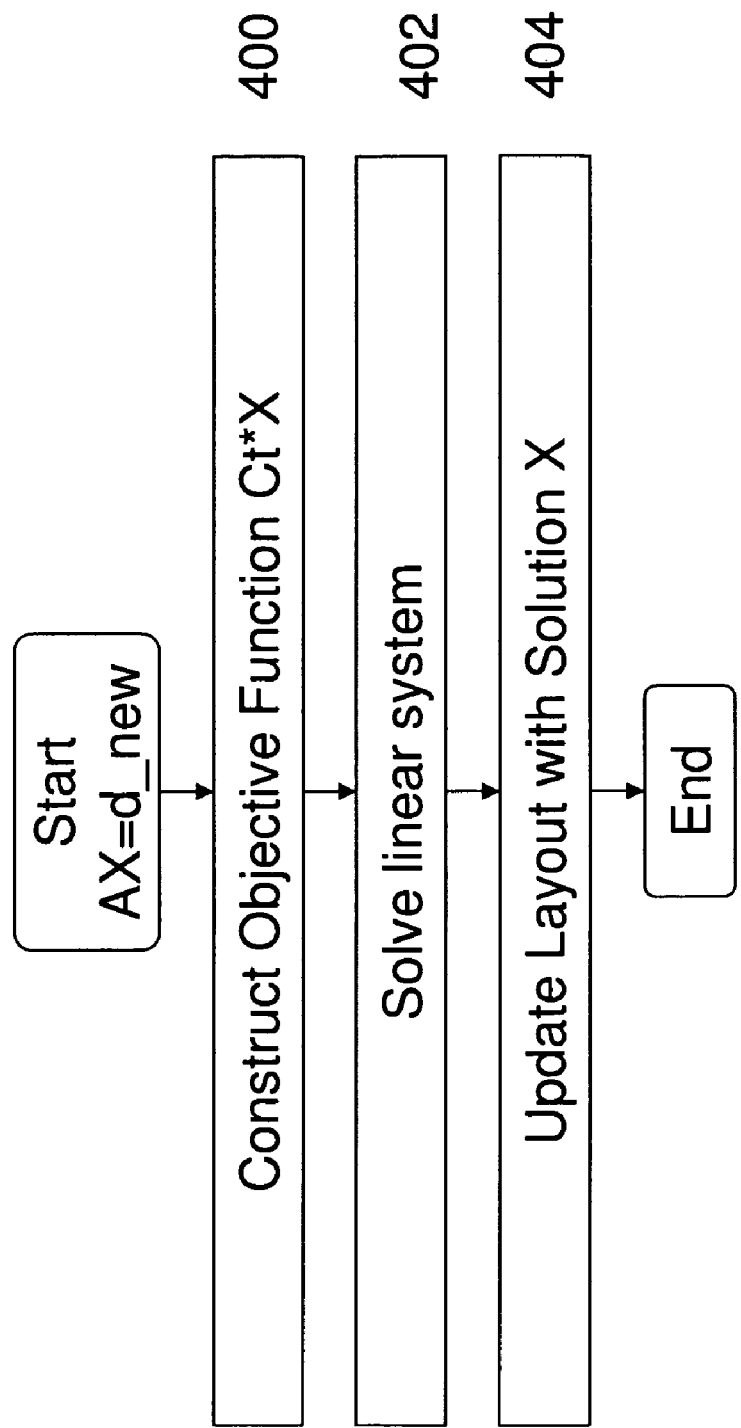
FIG. 4 is a flow and block diagram showing a preferred embodiment for implementing new constraint relationship obtained by combining local modification and initial constraint relationship.

FIG. 4 shows a preferred embodiment for local constraint enforcement. At the start of the procedure, we have a system of equations for local constraint, AX=d_new. The edge locations in the original layout are likely to violate some of the local constraint distances.

Block 400 constructs an objective function Ct*X, where Ct is a row vector of coefficients for achieving various optimization objectives, and X is the position variable in the layout. In a preferred embodiment, this objective function is combined with the linear constraint system A*X=d_new and forms a constrained optimization problem.

By receiving appropriate Ct values, we construct objective functions for wire length minimization, legalization, compaction, and other measurable metrics of layout.

Block 402 solves the linear system problem of minimizing Ct*X, subject to A*X=d_new. This is a standard form for a linear programming problem. Linear programming is a well established branch of mathematics where a large collection of solver packages are available, for example the CPLEX from ILOG Incorporated.

Block 404 updates the layout with the solution X of the linear system, which is similar to step 104 in FIG. 1.

In a version of the invention with one-dimensional method, the flow is performed one direction at a time, first horizontal (x) then vertical (y) or vice versa. Combined iterations mixing x and y steps can be employed as solution requires.

In two-dimensional method, the flow is performed for horizontal and vertical position variables simultaneously.

In another preferred embodiment, the local constraints are implemented one at a time using heuristic search procedures. This procedure searches the neighborhood of a given edge for spaces that can be used to satisfy the new constraint distance dij_new. When dij_new is equal or smaller than dij_old, the constraint relationship form xj−xi>dij_old (>dij_new) is always satisfied and no edge movement is mandatory. If, on the other hand, the new constraint distance is larger than the initial constraint distance, edge movement becomes mandatory and extra space must be found to move the edge in order to satisfy the new constraint distance. In a preferred embodiment, the inventor uses weighting factors such as w1 and w2 to control the amount of local modification such that the layout is largely compatible to design rules. This heuristic search technique gives more control than the constrained optimization method and is particularly useful when the required modifications are few and the layout is highly constrained. In yet another preferred embodiment, a combination of the techniques is applied.

Above mentioned means for enforcing new constraint relationships does not always result in a layout that is compatible to factory issued design rules, especially when the local modification is very large. Reformulating local modification can solve this problem. Also, in some cases occasional violations to design rules are permitted on an individual basis, when it is known that such exceptions to design rule compliance would not cause chip failure.

Iteration

The new layout produced by enforcing the new constraint relationship is different from the initial layout, except in the rare situation where the initial constraint relationship is such that no edge is allowed to move. In a preferred embodiment, the new layout is checked against a set of predefined criteria in order to decide if another iteration of the present method is needed. These criteria can be one or more of the structural or performance metrics that are of concern to a designer. Examples include design rule compliance, compliance to layout size and shape requirements, magnitude of improvements in the optimization metric such as printability, defect immunity, and variability, and circuit requirements such as delay, power, input capacitance and leakage.

A new iteration can start from any of the preceding steps 101, 102, or 103 depending on the nature of the optimization and result of checking. For example, if the topology of the constraint relationship changes, then a re-analysis of the constraint relationship is necessary and the iteration starts from block 101. If the topology does not change, then the iteration can start at a later step 102 or 103. The computation parameters used in various computation steps are adjusted adaptively during iteration in order to emphasize various aspects of the optimization process. The iteration terminates when the new layout satisfies a predetermined termination criteria, which comprise a predetermined iteration count.

Figure 5:
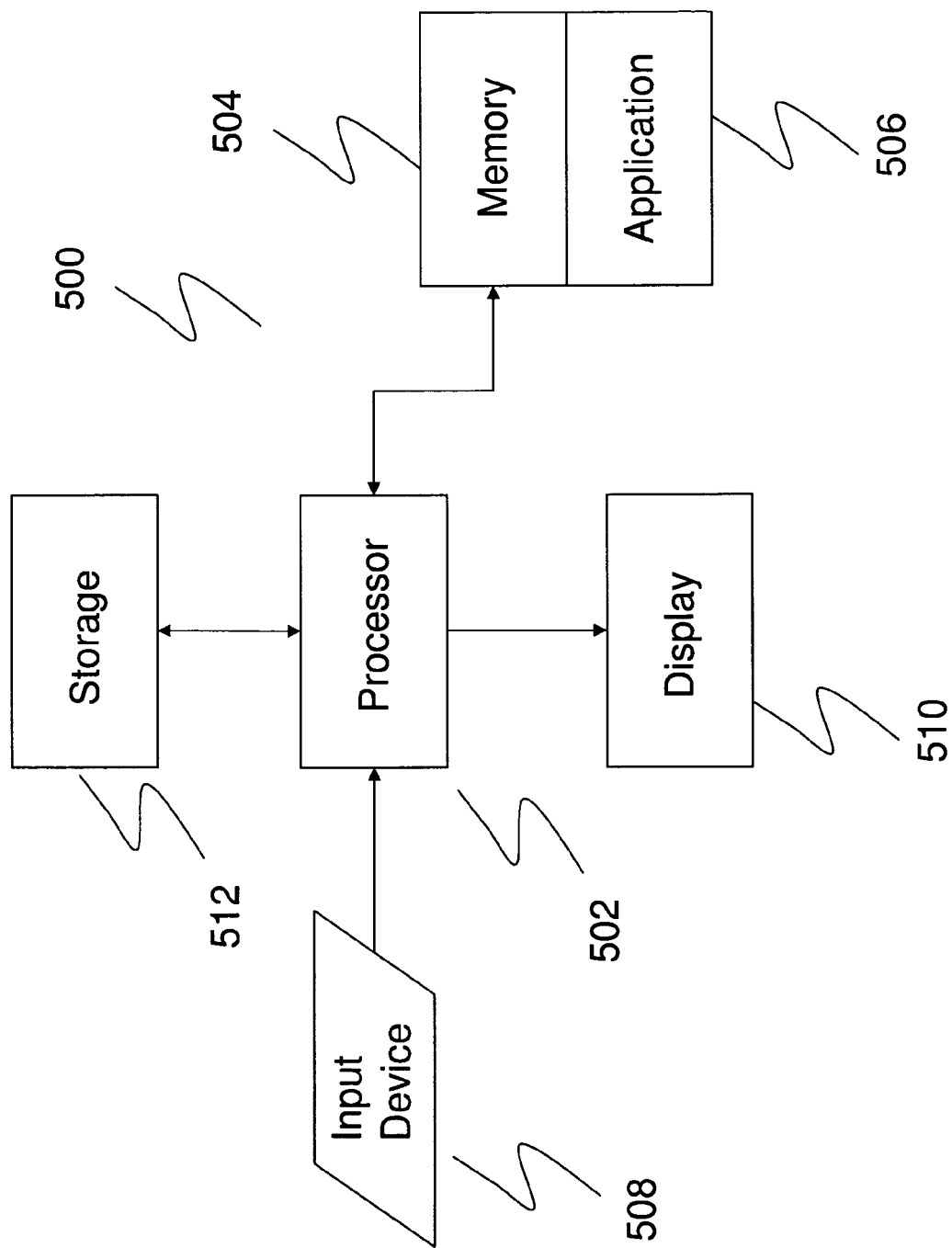
FIG. 5 is a block diagram showing a system for implementing the present invention.

Referring to FIG. 5, a block/flow diagram is shown for a system 500 of the present invention. System 500 includes a processor 502 that accesses memory device 504 and storage device 512. Memory device 504 stores an application software package 506 for implementing the present invention. Storage device 512 stores initial layout and output layout. A user interfaces with the processor 502 through an input device 508 which may include a keyboard, a mouse, a touch screen monitor, a voice recognition system or other known input devices. A display 510 is also included to display results, prompts, user inputs, graphics, etc.

While the present invention has been described in detail with regards to the preferred embodiments, it should be appreciated that various modifications and variations may be made in the present invention without departing from the scope or spirit of the invention. In this regard, it is important to note that practicing the invention is not limited to the applications described hereinabove. Many other applications and/or alterations may be utilized if such other applications and/or alterations do not depart from the intended purpose of the present invention.

It should further be appreciated by a person skilled in the art that features illustrated or described as part of one embodiment can be used in another embodiment to provide yet another embodiment such that the features are not limited to the specific embodiments described above. Thus, it is intended that the present invention cover such modifications, embodiments and variations as long as such modifications, embodiments and variations come within the scope of the appended claims and their equivalents.

What is claimed is:

1. A method suitable for integrated circuit layout processing using one or more microprocessors, the method comprising the steps of:
providing an initial design layout;
building constraint relationships associated with said initial design layout;
formulating at least one location dependent modification to said constraint relationships;
combining said location dependent modifications with said constraint relationships to form location dependent constraint relationships; and
implementing said location dependent constraint relationships, using said microprocessors, in a manner that is substantially in compliance with design rules;
whereby producing a new design layout with specific improvements that are derived from local layout conditions.

2. The method of claim 1, further comprising:
receiving a circuit description;
receiving design rules;
receiving a layout style template; and
generating said initial design layout, in accordance with said description, said layout style template, and in substantial compliance with said design rules.

3. The method of claim 1, further comprising:
extracting at least one layout block from a design layout;
formulating boundary constraints on said layout block;
optimizing said layout block in accordance with the method of claim 1 and in compliance with said boundary constraints to produce an optimized version of said layout block; and
replacing said layout block with said optimized layout block in said design layout.

4. The method of claim 1, wherein formulating location dependent modification comprises:
receiving metrics derived from said initial layout, comprising metrics selected from a group consisting of: image contour, edge placement error, light intensity during photolithography exposure, contrast, mask error enhancement factor, critical area, and their combinations thereof;
correlating said metrics to coordinate variables in said initial layout; and
calculating the changes to said coordinate variables that lead to an improvement in said metrics.

5. The method of claim 1, wherein implementing said location dependent constraint comprises:
constructing a system of constraint equations to represent said location dependent constraint relationships;
constructing an objective function comprising design objectives selected from a group consisting of: objective for minimizing circuit delay, objective for minimizing power, objective for minimizing leakage, objective for legalizing the layout with minimal changes from the original layout, objective for minimizing wire length, objective for minimizing the layout area, and their combinations thereof;
solving a constrained optimization problem with said objective function and subject to said system of constraint equations; and
updating the coordinate variables of at least one layout object in said initial design layout in accordance with the solution of said constrained optimization problem.

6. The method of claim 1, wherein formulating location dependent modification comprises:
computing, using the coordinate variables of said initial layout, one or more predetermined circuit metric comprising metrics selected from a group consisting of: current values at one or more voltages for one or more amplification devices, circuit delay, power, leakage, and their combinations thereof;
evaluating the discrepancy between said metric and a predetermined target value; and
calculating the changes to said coordinate variables that lead to the reduction of said discrepancy.

7. The method of claim 1, wherein formulating location dependent modification comprises:
computing the current of an amplification device using the coordinate variables of said initial layout;
computing the difference between said current to a predetermined design target;
computing the change in the size of said amplification device that minimize said difference.

8. An integrated circuit product processed by the method of claim 1.

9. A non-transitory computer-readable medium having program instructions suitable for processing integrated device layout, comprising:
instructions for providing an initial design layout;
instructions for building constraint relationships among layout objects in said initial design layout to form initial constraint relationships;
instructions for formulating at least one location dependent modifications to said constraint relationships;
instructions for combining said location dependent modifications with said constraint relationships to form location dependent constraint relationships; and instructions for implementing said location dependent constraint relationships to form an optimized layout that is substantially in compliance with design rules.

10. The computer-readable medium of claim 9, further comprising:
   instructions for receiving a circuit description;
   instructions for receiving design rules;
   instructions for receiving a layout style template; and
   instructions for generating said initial design layout, in accordance with said description, said layout style template, and in substantial compliance with said design rules.

11. The computer-readable medium of claim 9, further comprising:
   instructions for extracting at least one layout block from a design layout;
   instructions for formulating boundary constraints on said layout block;
   instructions for optimizing said layout block in compliance with said boundary constraints to form an optimized layout block; and
   instructions for replacing said layout block with said optimized layout block in said design layout.

12. The computer-readable medium of claim 9, wherein the instructions for formulating location dependent modification comprise:
   instructions for receiving metrics derived from said initial layout, comprising metrics selected from a group consisting of image contour, edge placement error, light intensity during photolithography exposure, contrast, and mask error enhancement factor, critical area, and their combinations thereof;
   instructions for correlating said metrics to coordinate variables in said initial layout, and
   instructions for calculating the changes to said coordinate variables that lead to an improvement in said metrics.

13. The computer-readable medium of claim 9, wherein the instructions for implementing said location dependent constraint relationships comprise:
   instructions for constructing a system of constraint equations to represent said new constraint relationships;
   instructions for constructing an objective function comprising design objectives selected from a group consisting of: objective for minimizing circuit delay, objective for minimizing power, objective for minimizing leakage, objective for legalizing the layout with minimal changes from the original layout, objective for minimizing wire length, objective for minimizing the layout area, and their combinations thereof;
   instructions for solving a constrained optimization problem with said objective function and subject to said system of constraint equations; and
   instructions for updating the coordinate variables of at least one layout object in said initial design layout in accordance with the solution of said constrained optimization problem.

14. The computer-readable medium of claim 9, wherein the instructions for formulating location dependent modification comprise:
   instructions for computing circuit metrics comprising metrics selected from a group consisting of: current values at one or more voltages for one or more amplification devices, circuit delay, power, leakage, and their combinations thereof, using the coordinate variables of said initial layout;
   instructions for evaluating the discrepancy between said metric and a predetermined target value; and
   instructions for calculating the changes to said coordinate variables that lead to the reduction of said discrepancy.

15. An apparatus for processing integrated device layout comprising:
   storage means for storing an initial design layout;
   processor means for processing data associated with said initial design layout;
   first means for building constraint relationships among layout objects in said initial design layout to form initial constraint relationships;
   second means for formulating location dependent modifications to said initial constraint relationships;
   third means for combining said location dependent modifications with said initial constraint relationships to form new location dependent constraint relationships; and
   fourth means for implementing said new location dependent constraint relationships to form an optimized layout that is substantially in compliance with design rules.

16. The apparatus of claim 15, further comprising:
   input means for receiving a circuit description;
   input means for receiving design rules;
   input means for receiving a layout style template; and
   means for generating initial design layout, in accordance with said description, said layout style template, and in substantial compliance with said design rules.

17. The apparatus of claim 15, further comprising:
   means for extracting at least one layout block from a design layout;
   means for formulating boundary constraints on said layout block;
   means for optimizing said layout block in compliance with said boundary constraints to produce an optimized layout block; and
   means for replacing said layout block with said optimized layout block in said design layout.

18. The apparatus of claim 15, wherein said second means for formulating location dependent modification comprises:
   means for receiving performance metric derived from said initial layout, comprising metrics selected from a group consisting of: image contour, edge placement error, light intensity during photolithography exposure, contrast, and mask error enhancement factor, critical area, and their combinations thereof;
   means for correlating said performance metric to coordinate variables in said initial layout; and
   means for calculating the changes to said coordinate variables that lead to an improvement in said performance metric.

19. The apparatus of claim 15, wherein said fourth means for implementing said new location dependent constraint relationships comprises:
   means for constructing a system of constraint equations to represent said new constraint relationships;
   means for constructing an objective function comprising design objectives selected from a group consisting of: objective for minimizing circuit delay, objective for minimizing power, objective for minimizing leakage, objective for legalizing the layout with minimal changes from the original layout, objective for minimizing wire length, objective for minimizing the layout area, and their combinations thereof;
   means for solving a constrained optimization problem with said objective function and subject to said system of constraint equations; and means for updating the coordinate variables of at least one layout object in said initial design layout in accordance with the solution of said constrained optimization problem.

20. The apparatus of claim 15, wherein said second means for formulating location dependent modification comprises:
means for computing circuit metrics selected from a group consisting of: current values at one or more voltages for one or more amplification devices, circuit delay, power, leakage, and their combinations thereof, using the coordinate variables of said initial layout;
means for evaluating the discrepancy between said metric and a predetermined target value; and
means for calculating the changes to said coordinate variables that lead to the reduction of said discrepancy.

* * * * *